(12) United States Patent
Reimann

(10) Patent No.: US 7,000,311 B1
(45) Date of Patent: Feb. 21, 2006

(54) VACUUM PIPETTE FOR GRIPPING ELECTRICAL COMPONENTS BY SUCTION

(75) Inventor: Guenter Reimann, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 381 days.

(21) Appl. No.: 10/129,803

(22) PCT Filed: Nov. 6, 2000

(86) PCT No.: PCT/DE00/03883

§ 371 (c)(1),
(2), (4) Date: May 9, 2002

(87) PCT Pub. No.: WO01/35710

PCT Pub. Date: May 17, 2001

(30) Foreign Application Priority Data

Nov. 9, 1999 (DE) ................................. 199 53 881

(51) Int. Cl.
*B23P 19/00* (2006.01)
(52) U.S. Cl. ............................. 29/743; 29/740; 29/741; 29/742; 294/64.1
(58) Field of Classification Search .......... 29/739–743; 901/40; 414/737, 752; 294/2, 64.1
See application file for complete search history.

(56) References Cited

U.S. PATENT DOCUMENTS

| 4,770,454 A | * | 9/1988 | Muscher et al. ........... 294/64.1 |
| 4,787,662 A | * | 11/1988 | Dewez ....................... 294/64.1 |
| 5,143,631 A | * | 9/1992 | Furrer ........................ 210/791 |
| 5,467,525 A | * | 11/1995 | Pine et al. .................... 29/743 |
| 5,580,529 A | * | 12/1996 | DeVaughn et al. ......... 422/101 |
| 5,928,537 A | * | 7/1999 | Fortune ...................... 219/230 |
| 6,043,458 A | * | 3/2000 | Fortune ...................... 219/230 |
| 6,117,394 A | * | 9/2000 | Smith ......................... 422/100 |
| 6,298,547 B1 | * | 10/2001 | Okuda et al. ................. 29/740 |

FOREIGN PATENT DOCUMENTS

| JP | 401266859 A | * | 10/1989 |
| JP | 2-170600 | | 7/1990 |
| JP | 2170600 | * | 7/1990 |
| JP | 09108578 A | * | 4/1997 |
| JP | 10-242694 | | 9/1998 |
| WO | WO 98/33369 | | 7/1998 |

* cited by examiner

*Primary Examiner*—A. Dexter Tugbang
*Assistant Examiner*—Terri Lynn Smith
(74) *Attorney, Agent, or Firm*—Schiff Hardin LLP

(57) ABSTRACT

A vacuum pipette has a filter grid that is shifted into its extended interior and whose cross section is considerably greater than the cross section of an end-side suction opening. The gaps formed in the filter grid can be so narrow that even very small components are reliably retained. Nevertheless, the entire passage cross section available is considerably greater than in the case of a filter grid arranged at the end side. As a result, favorable suction forces are generated under constant suction conditions.

4 Claims, 1 Drawing Sheet

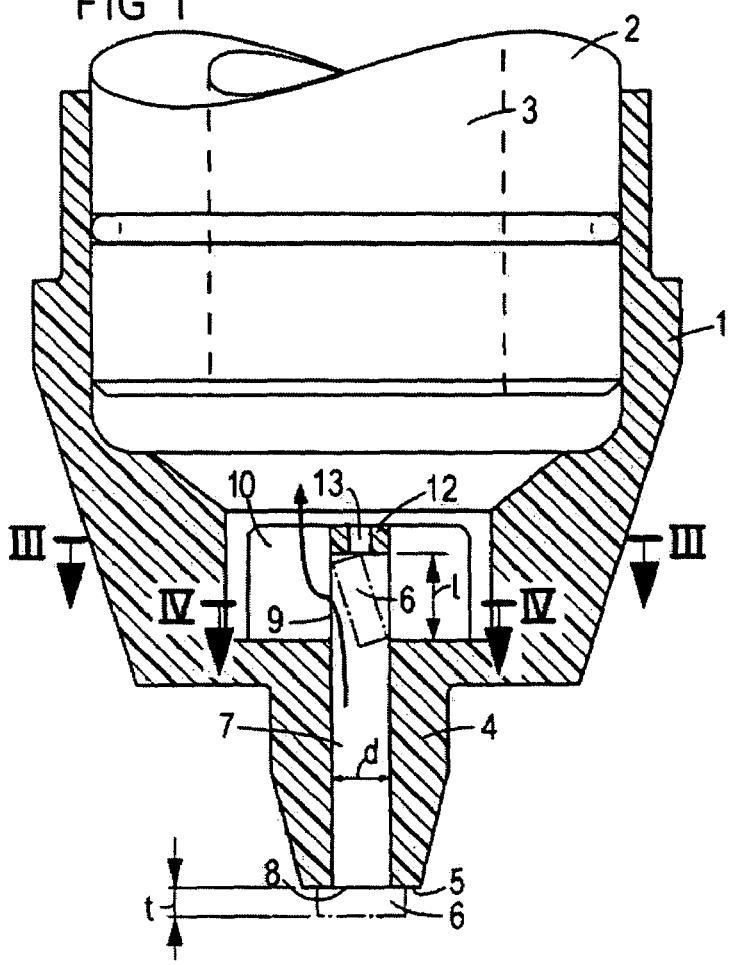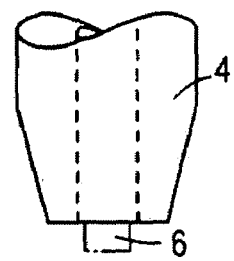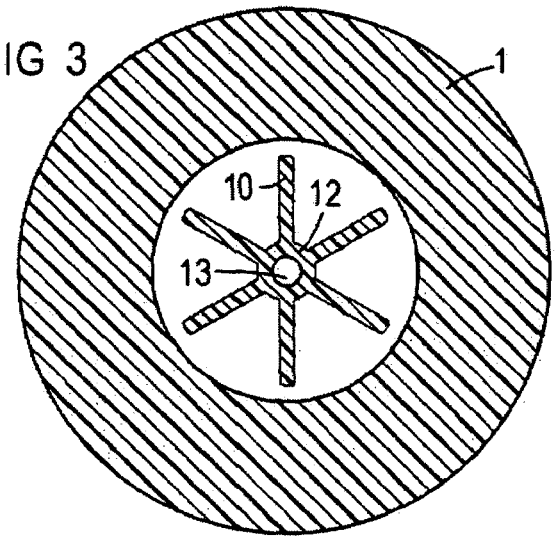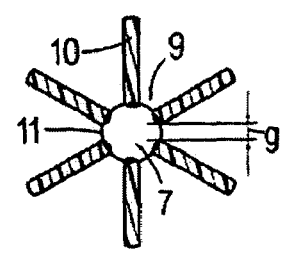

VACUUM PIPETTE FOR GRIPPING ELECTRICAL COMPONENTS BY SUCTION

BACKGROUND OF THE INVENTION

1. Field of the Invention

The invention relates to a vacuum pipette for gripping electrical components by suction. The vacuum pipette is configured for mounting in an exchangeable manner onto a shaft of a placement head of an automatic placement machine, and the component being grippable by suction onto an end side of the vacuum pipette, where the end side is remote from the shaft.

2. Description of the Related Art

A vacuum pipette of this type has been disclosed, for example, by International Patent Document WO 98/33369 A. Accordingly, this vacuum pipette has a central vacuum channel which merges with an end-side suction opening which is provided with a filter grid. The latter is intended to prevent small components from getting sucked into the suction channel. The correspondingly narrow passage openings of the filter grid reduce the suction cross section to such a great extent that the suction force no longer suffices to reliably hold larger components.

The components are provided closely spaced apart in belts, for example. There is a risk, particularly in the case of small components, that during collection, components from adjacent pockets will be gripped by suction. In order to eliminate this risk, the suction grid must be kept correspondingly narrow. The pitch spacing between the grid webs must be kept as large as possible so that the cross section is not excessively reduced by the grid webs. But this creates a risk that components having a very small cross section will tip over into one of the passage openings and be sucked through edgewise. Since the cross section of the suction channel is relatively large, the component may be drawn unimpeded into the control and generator system for the vacuum and cause functional disturbances there, in particular through accumulations.

Component miniaturization currently extends down to dimensions of 0.25×0.25×0.5 mm. Correspondingly fine passage openings can no longer be realized by injection molding, so that the sucking-in risk is particularly high here. An erroneous vacuum interrogation can cause the vacuum pipette without component to be contaminated with solder paste of the printed circuit board, resulting in a reduction of the suction cross section of the filter grid, and a vacuum interrogation leads to evaluation errors. The different suction cross sections of the filter grids of different types of pipettes result in very different vacuum threshold values for the detection of the presence of a component, and thus the interrogation reliability is correspondingly impaired.

Furthermore, Japanese patent document JP 10-242694 A discloses a placement head with a shaft having a holder for the vacuum pipette fitted to its free end. The suction channel of the vacuum pipette is formed such that it is continuous over its whole area. Also, a filter device for the suction air is placed onto the shaft end that prevents sucked-in particles from passing into the interior of the placement head. Due to the labyrinthine flow profile, sucked-in particles can accumulate between the shaft and the center sleeve and, with a relatively long use of the vacuum pipette, constrict the flow cross section to such a great extent that the vacuum interrogation is disturbed. The filter device itself is part of the holder and must be exchanged when a specific degree of blockage has been reached.

In a similar manner, according to Japanese patent document JP 2-170600 A, a filter cylinder with an extended filter grid is placed onto a tubular holder of a placement head, the exchangeable vacuum pipette configured for mounting onto the free end of the filter cylinder. The filter cylinder constitutes, in the extension of the holder, a separate intermediate element that requires an additional mounting step with an additional coupling point, reduces the installation accuracy of the vacuum pipette, and increases the structural height. The increased distance between the pipette tip and the holder additionally reduces the stiffness of the system, which, under the influence of the high accelerations of the positioning movements, leads to a reduction of the positioning accuracy.

SUMMARY OF THE INVENTION

The invention is based on the object of increasing the functional reliability of the placement head.

This object is achieved by a vacuum pipette for gripping electrical components by suction, the vacuum pipette configured for mounting in an exchangeable manner onto a shaft of a placement head of an automatic placement machine, the vacuum pipette comprising an end side that is remote from the shaft to which the component is gripped by suction; an end-side suction opening on the end side formed to be open over its whole area; a suction channel merging with the end-side suction opening on the end side and configured to be connectable to a vacuum line of the shaft; and a filter grid comprising passage openings for suction air generated by a vacuum being incorporated into the vacuum pipette in a region of the suction channel, the filter grid, at a distance from the end side, being displaced into an extended interior space of the vacuum pipette, a cross sectional area of the filter grid being greater than a cross sectional area of the suction opening.

The arrangement of the filter in the individual vacuum pipettes makes it possible to largely adapt the filter region to the size of the components gripped by suction. Furthermore, the filter can be formed in a region near the suction opening. When the components are placed onto a printed circuit board, a compressed-air pulse is usually connected to the suction channel. This facility can be utilized for periodically blowing out accumulated particles.

The close assignment of the filter to the vacuum pipette makes it possible to integrate the filter in the vacuum pipette in one piece and thus to form the filter cost-effectively using corresponding molds with very little additional outlay. The pipettes are usually wearing parts which are periodically changed in a fully automatic manner. In this case, the accumulated disturbing particles are concomitantly removed without any additional outlay, which is also possible in the case of premature blockage.

The displacement of the filter grid into the interior of the vacuum pipette makes it possible for the suction opening to be formed over the whole area at the end face, whereby the suction cross section is correspondingly enlarged. The filter grid is arranged in a region in which a larger cross section is available for the filter grid so that the entire grid cross section can be made considerably greater. The number and the suction cross section of the individual passage openings can be correspondingly enlarged, whereby the entire suction cross section is enlarged in this region. Nevertheless, the passage openings can be kept so narrow that even the smallest components are reliably retained. The latter no longer pass into the interior of the placement head. Even with a component that has been sucked in, sufficient residual cross section remains to ensure the function of the vacuum interrogation. The sucked-in component can be moved using a collecting container and be expelled from the suction channel using a blast-air pulse.

Advantageous developments of the invention include configuring the filter grid so that it is formed from a plurality of wing-like lamellae that are distributed peripherally around the suction channel, extend in an axial direction of the suction channel and project radially from the suction channel; and having the suction channel being closed by a bottom at an inner end of the lamellae. Gaps that form the passage openings may be formed between the lamellae and whose width is narrower than the smallest thickness of the smallest component to be gripped. The length of the gaps may be so large that the entire opening cross sectional area of the filter grid is greater than the end-side cross sectional area of the suction opening. The inventive vacuum pipette may further comprise at least one further passage opening at the bottom having a reduced cross sectional area.

In more detail, the filter grid may be formed from a plurality of wing-like lamellae that are distributed peripherally around the suction channel, extend in the axial direction of the suction channel, and project radially from the latter, and the suction channel may be closed by a bottom at the inner end of the lamellae.

This filter grid may be produced with gaps that extend in the axial direction and through which the suction air flows in the radial direction. These gaps can be made very narrow and long and enable an overall suction cross section which is considerably greater than in the case of a suction grid in the suction opening. The full suction pressure can thus be built up at the latter.

The passage openings may be formed by gaps that are formed between the lamellae and whose width is narrower than the smallest thickness of the smallest component to be gripped. This ensures that even very small components cannot be sucked into the interior of the shaft.

The length of the gaps may be so large that the entire opening cross section of the filter grid is greater than the end-side cross section of the suction opening. This permits keeping the opening cross section of the filter grid so large that it does not impair the vacuum interrogation.

The bottom may be provided with at least one further passage opening of reduced cross section, the suction grid being also expanded to the bottom, and the width of the passage opening being adaptable to the width of the gaps.

DESCRIPTION OF THE DRAWINGS

The invention is explained in more detail below using an exemplary embodiment illustrated in the drawings.

FIG. 1 is a longitudinal section view through a vacuum pipette with a shaft of a placement head and an electrical component;

FIG. 2 is a side view of a part of the vacuum pipette according to an embodiment of the invention;

FIG. 3 is a section view along the line III—III in FIG. 1; and

FIG. 4 is a partial section view along the line IV—IV in FIG. 1.

DETAILED DESCRIPTION OF THE INVENTION

According to FIG. 1, a vacuum pipette 1 is mounted onto the end of a cylindrical shaft 2 of a placement head. The shaft 2 has a vacuum line 3 to which a vacuum, atmosphere or compressed air can be applied in a controllable manner using pneumatic units and valves. The vacuum pipette 1, which may be produced by injection molding, has a suction tip 4 that is coaxial with respect to the shaft and whose end side 5 remote from the shaft 2 serves as a bearing area for components 6 to be gripped by suction. The suction tip 4 has a central suction channel 7 that merges with an end-side suction opening 8 for the components 6 to be gripped by suction. The length of the component 6 gripped by suction is greater than the diameter of the suction opening 8 so that it is supported at both ends on the end side 5 of the shaft.

FIG. 2 illustrates the end side of the component 6. It can be seen from this figure that the width, the thickness, and the diagonal of the parallelepipedal component 6 are smaller than the diameter d of the suction channel 7 which is operatively connected to the vacuum line 3 of the shaft. If the component 6 has an eccentric bearing, the component 6 can tip over into the suction opening 8 and be sucked into the suction channel 7.

According to FIGS. 1, 3 and 4, the vacuum pipette is widened subsequent to the narrow suction tip in a stepped manner to a diameter which encloses a considerably larger structural space. A filter grid 9 is arranged in this region, through which filter grid the suction air can flow in accordance with the s-shaped arrow illustrated. The filter grid 9 comprises wing-like lamellae 10 which project radially around the lengthened suction channel, extend in the axial direction of the suction channel and are arranged peripherally in the same pitch. The lamellae 10 form narrow gaps 11 along their mutually facing inner sides, the gaps having a width g and the length l. The total area of the passage openings of the filter grid 9 which are formed by the gaps is considerably greater than the cross section of the suction opening 8. The width g is less than the thickness t of the component 6, so that a sucked-in component 6 is reliably retained. On their outer sides, the lamellae 10 are open toward the vacuum line 3 and are pneumatically connected to the latter. At the inner end of the lamellae 10 which faces the shaft 2, the suction channel 7 is closed by a bottom 12, which, for its part, can be provided with narrow passage openings 13 for the suction air.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The particular implementations shown and described herein are illustrative examples of the invention and are not intended to otherwise limit the scope of the invention in any way. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

The invention claimed is:

1. A vacuum pipette for gripping electrical components by suction, the vacuum pipette configured for mounting in an exchangeable manner onto a shaft of a placement head of an automatic placement machine, the vacuum pipette comprising:

an end side that is remote from the shaft to which the component is gripped by suction;

an end-side suction opening on the end side formed to be open over an entire area of the end side suction opening;

a suction channel merging with the end-side suction opening on the end side and configured to be connectable to a vacuum line of the shaft; and a filter grid comprising passage openings for suction air generated by a vacuum being incorporated into the vacuum pipette in a region of the suction channel, the filter grid, at a distance from the end side, being displaced into an extended interior space of the vacuum pipette, a cross sectional area of the filter grid being greater than a cross sectional area of the suction opening;

wherein the filter grid is formed from a plurality of lamellae that are distributed peripherally around the suction channel, extend in an axial direction of the suction channel and project radially from the suction channel; and the suction channel is closed by a bottom at an inner end of the lamellae which faces the shaft.

2. The vacuum pipette as claimed in claim 1, further comprising:

gaps that form the passage openings that are formed between the lamellae and whose width is narrower than a smallest thickness of the smallest component to be gripped.

3. The vacuum pipette as claimed in claim 2, wherein:

a length of the gaps is so large that the entire opening cross sectional area of all individual air passage openings of the filter grid is greater than the end-side cross sectional area of the suction opening.

4. The vacuum pipette as claimed in claim 1, further comprising:

at least one further passage opening at the bottom having a reduced cross sectional area.

* * * * *